US008829985B2

(12) United States Patent
Niitsu et al.

(10) Patent No.: US 8,829,985 B2
(45) Date of Patent: Sep. 9, 2014

(54) TIME DIFFERENCE AMPLIFIER CIRCUIT

(75) Inventors: Kiichi Niitsu, Kiryu (JP); Naohiro Harigai, Kiryu (JP); Masato Sakurai, Kiryu (JP); Haruo Kobayashi, Kiryu (JP)

(73) Assignee: Semiconductor Technology Academic Research Center, Yokohama-shi (JP)

( * ) Notice: Subject to any disclaimer, the term of this patent is extended or adjusted under 35 U.S.C. 154(b) by 0 days.

(21) Appl. No.: 13/601,139

(22) Filed: Aug. 31, 2012

(65) Prior Publication Data
US 2013/0234792 A1    Sep. 12, 2013

(30) Foreign Application Priority Data
Sep. 21, 2011   (JP) .................................. 2011-206258

(51) Int. Cl.
    *G06G 7/12*         (2006.01)
    *G06G 7/26*         (2006.01)

(52) U.S. Cl.
    USPC .............................................. 327/563; 330/9

(58) Field of Classification Search
    USPC .............................................. 327/563; 330/9
    See application file for complete search history.

(56) References Cited

U.S. PATENT DOCUMENTS

| | | | | |
|---|---|---|---|---|
| 6,262,626 B1 * | 7/2001 | Bakker et al. | ...................... | 330/9 |
| 7,262,654 B2 * | 8/2007 | Kejariwal et al. | .................. | 330/9 |
| 7,456,684 B2 * | 11/2008 | Fang et al. | .......................... | 330/9 |
| 2003/0189461 A1 * | 10/2003 | Huijsing et al. | ................... | 330/9 |

FOREIGN PATENT DOCUMENTS

| | | |
|---|---|---|
| JP | 60-219560 A | 11/1985 |
| JP | 61-227422 A | 10/1986 |
| JP | 62-126709 A | 6/1987 |

OTHER PUBLICATIONS

A. M. Abas, et al., "Time difference amplifier", Electronics Letters, vol. 38, No. 23, Nov. 7, 2002, pp. 1437-1438.
Minjae Lee, et al., "A 9 b, 1.25 ps. Resolution Coarse—Fine Time-to-Digital Converter in 90 nm CMOS that Amplifies a Time Residue", IEEE Journal of Solid-State Circuits, vol. 43, No. 4, Apr. 2008, pp. 769-777.
Seon-Kyoo Lee, et al., "A 1 GHz ADPLL With a 1.25 ps Minimum-Resolution Sub-Exponent TDC in 0.18 μm CMOS", IEEE Journal of Solid-State Circuits, vol. 45, No. 12, Dec. 2010, pp. 2874-2881.
Office Action issued Sep. 17, 2013, in Japanese Patent Application No. 2011-206258 with English translation.

* cited by examiner

Primary Examiner — Quan Tra
(74) Attorney, Agent, or Firm — Oblon, Spivak, McClelland, Maier & Neustadt, L.L.P.

(57) ABSTRACT

According to one embodiment, a time difference amplifier circuit includes the first amplifier including first positive and negative inputs and first positive and negative outputs, the second amplifier including second positive and negative inputs and second positive and negative outputs, first to fourth wirings, a selection circuit including the first selection element connecting the first or fourth wirings to the second positive input, and the second selection element connecting the second or third wirings to the second negative input, and a control circuit connecting the amplifiers by the first and second wirings or by the third and fourth wirings.

5 Claims, 10 Drawing Sheets

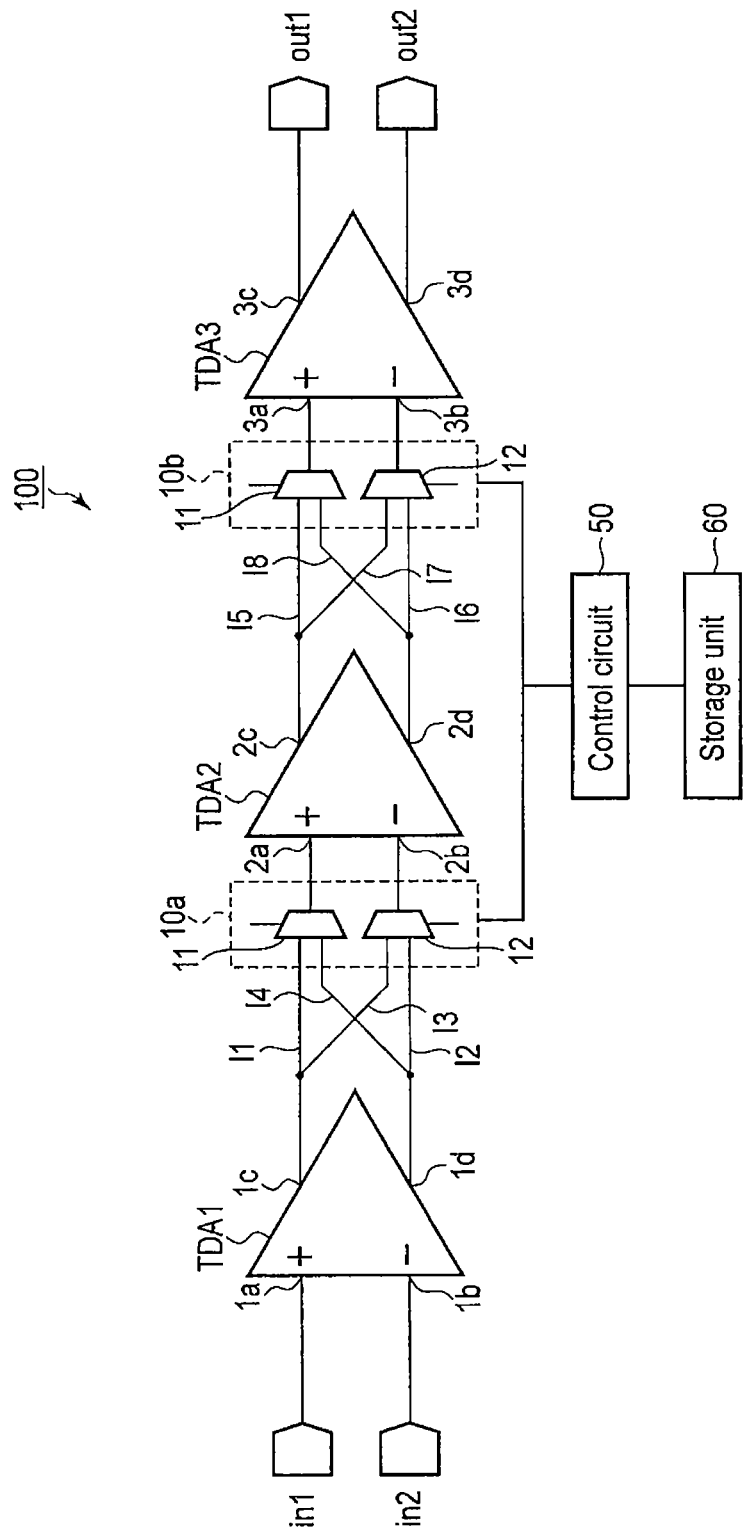
F I G. 2

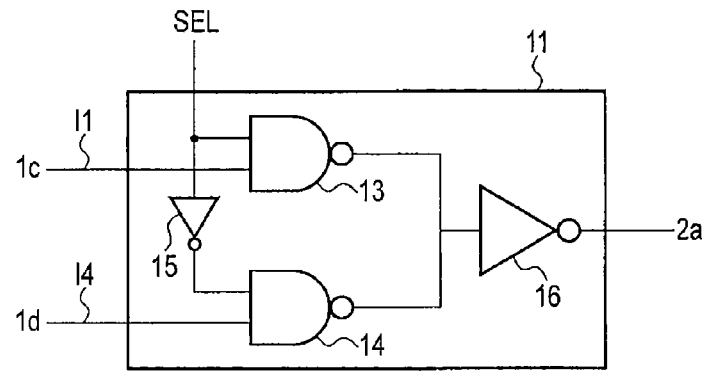
F I G. 3
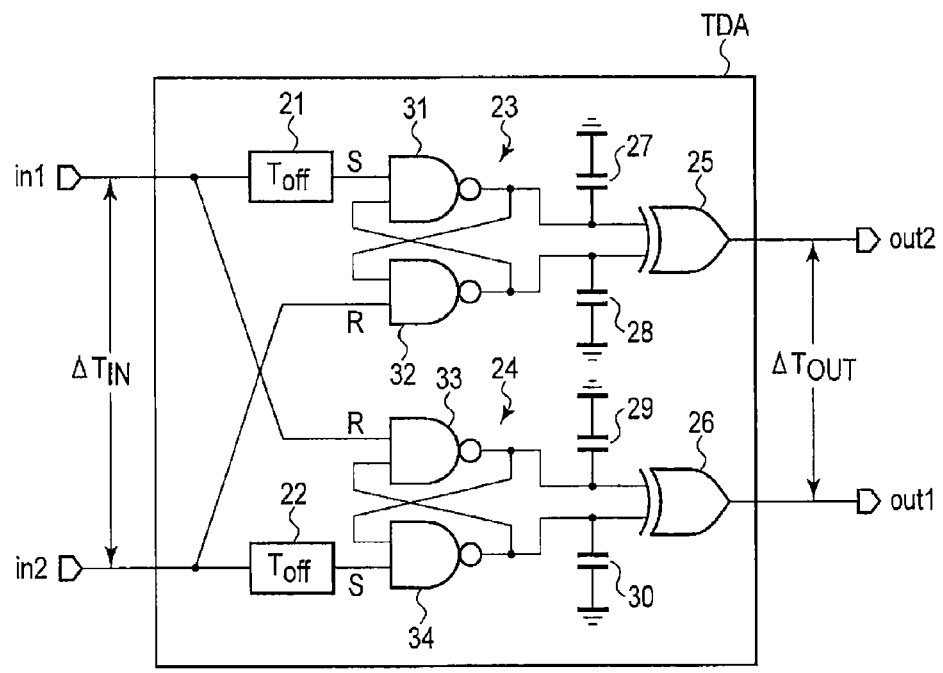
F I G. 4

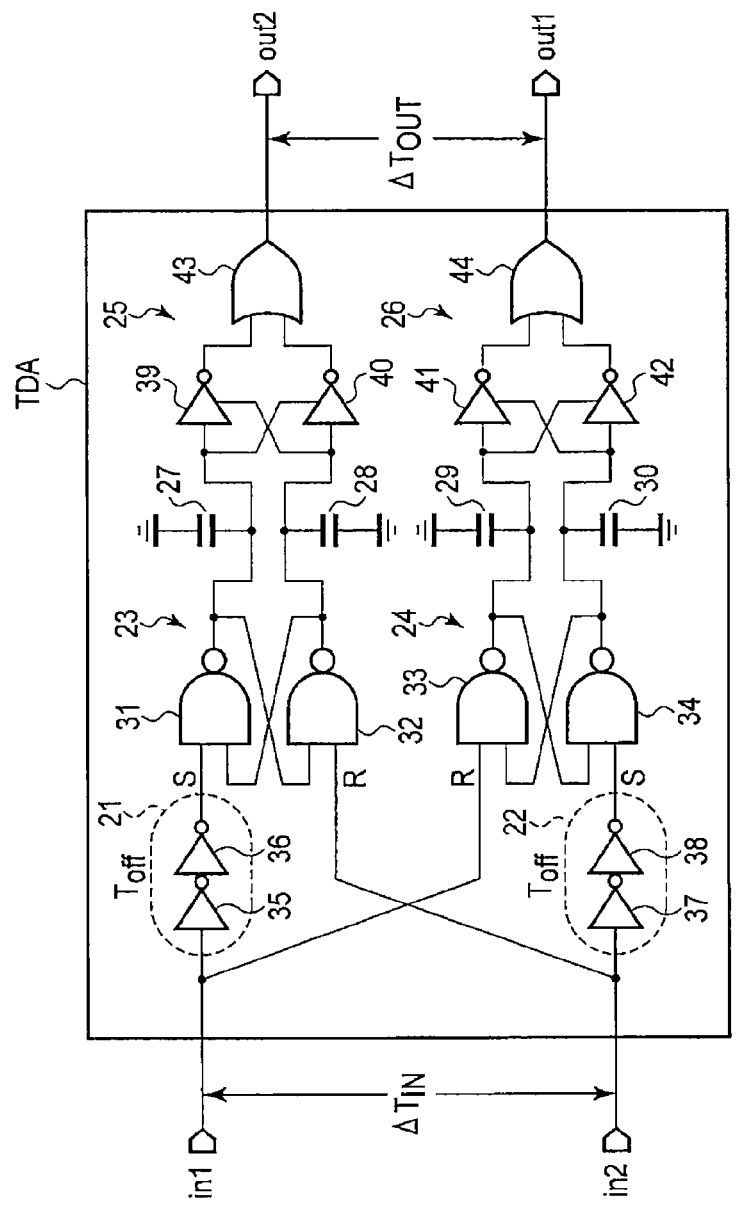
F I G. 5

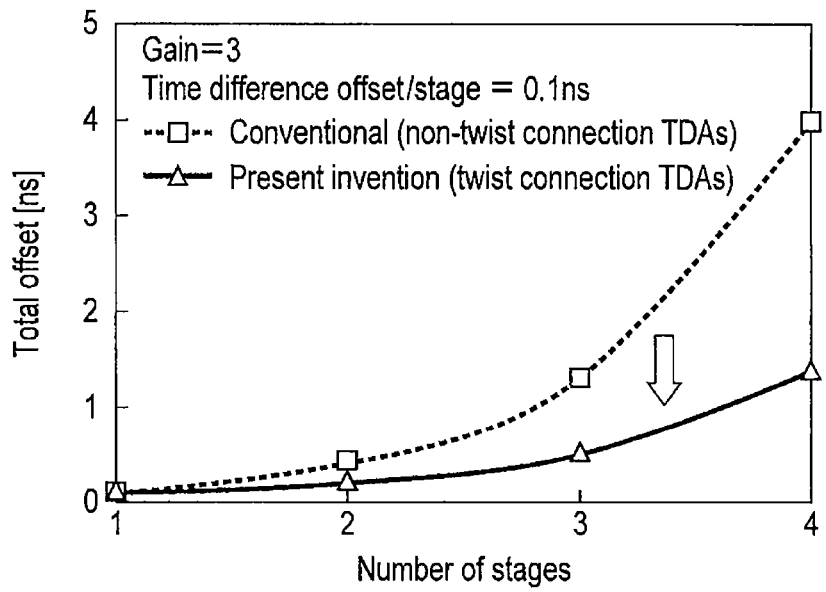
F I G. 10
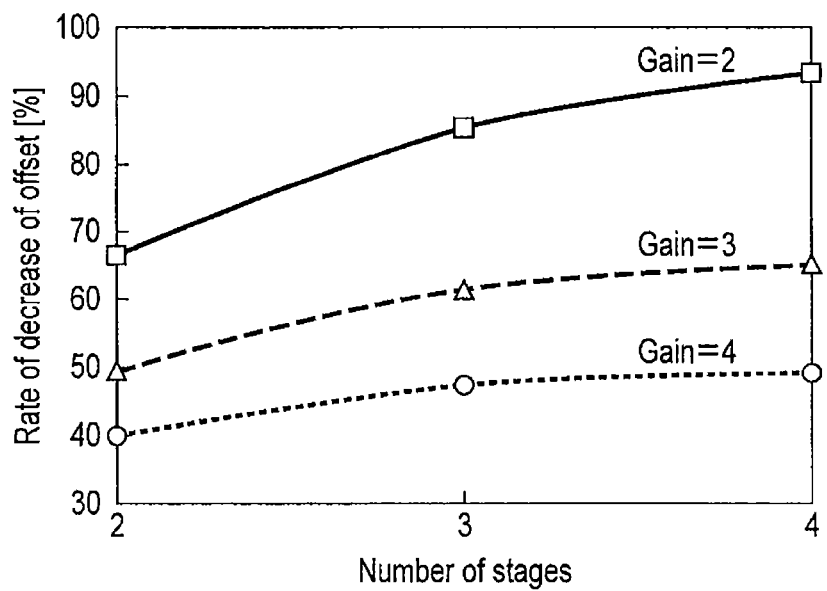
F I G. 11

TIME DIFFERENCE AMPLIFIER CIRCUIT

CROSS-REFERENCE TO RELATED APPLICATIONS

This application is based upon and claims the benefit of priority from Japanese Patent Application No. 2011-206258, filed Sep. 21, 2011, the entire contents of which are incorporated herein by reference.

FIELD

Embodiments described herein relate generally to a cascaded time difference amplifier circuit.

BACKGROUND

The principle of a time difference amplifier (TDA) was announced in 2003. Since then, many research institutes have enthusiastically made research and development. In 2008, a team of A. A. Abide confirmed operations in circuit implementations and actual silicon, and reported applications to high-resolution time-to-digital converters (TDCs). A cascaded time difference amplifier circuit has been announced for a TDC in an ADPLL (All Digital Phase Locked Loop).

When cascading time difference amplifiers, a conventional technique wires them to shorten the wiring length. Since a wiring arrangement considering a time difference offset has not been examined, the time difference offset becomes large. Particularly, a large offset is generated in a wiring arrangement which increases the time difference offset in time difference amplifiers at respective stages (wiring arrangement has $2^{(n-1)}$ combinations wherein n is the number of stages).

BRIEF DESCRIPTION OF THE DRAWINGS

FIG. 2 is a diagram showing a selection circuit according to the embodiment of the present invention;

FIG. 3 is a circuit diagram showing a selection element according to the embodiment of the present invention;

FIG. 4 is a circuit diagram showing a time difference amplifier according to the embodiment of the present invention;

FIG. 5 is a circuit diagram showing another time difference amplifier according to the embodiment of the present invention;

FIG. 10 is a graph showing the total time difference offset with respect to the number of stages in the conventional time difference amplifier circuit and the time difference amplifier circuit according to the present invention;

FIG. 11 is a graph showing the rate of decrease of the total time difference offset with respect to the number of stages and the gain in the time difference amplifier circuit according to the present invention.

DETAILED DESCRIPTION

Figure 1:
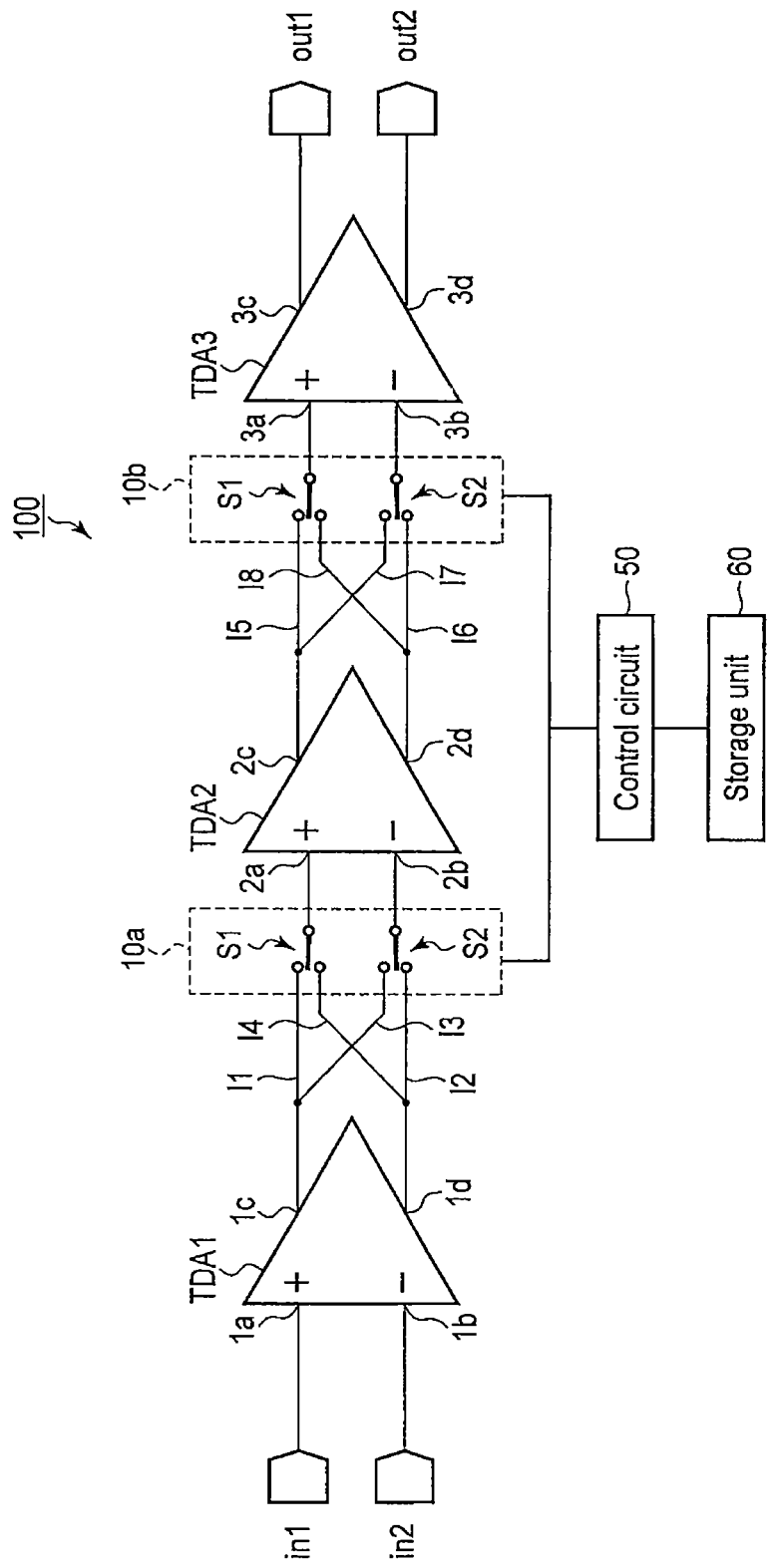
FIG. 1 is a diagram showing a time difference amplifier circuit according to an embodiment of the present invention.
Figure 6:
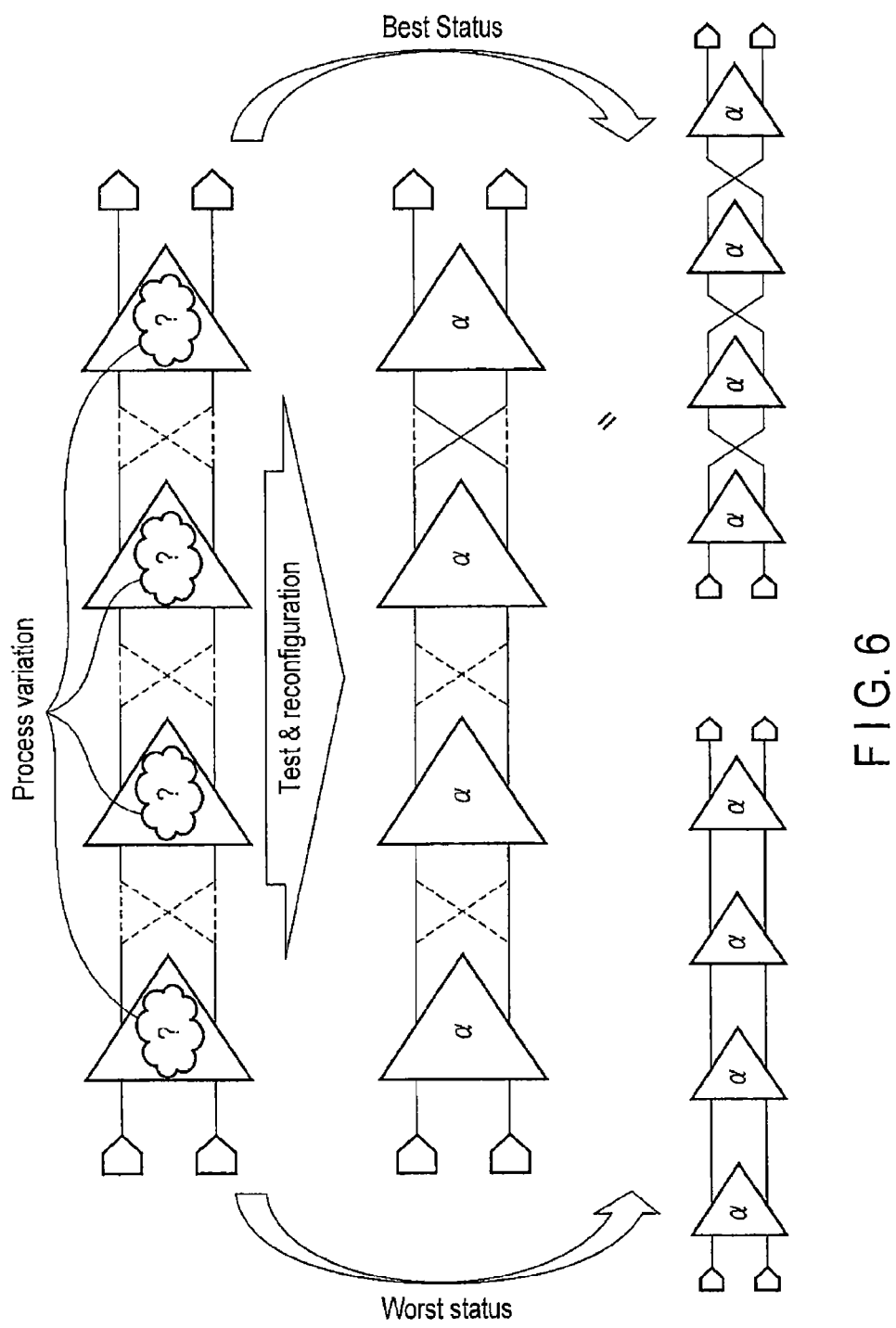
FIG. 6 is a view showing an outline of a time difference amplifier circuit according to the present invention.

In general, according to one embodiment, a time difference amplifier circuit in which a plurality of time difference amplifiers are cascaded, each of the plurality of time difference amplifiers amplifying a rising edge time difference between two input signals and outputting the amplified rising edge time difference as a rising edge time difference between two output signals, and each of the plurality of time difference amplifiers including a first time difference amplifier and a second time difference amplifier, including: the first time difference amplifier configured to include a first positive input terminal, a first negative input terminal, a first positive output terminal, and a first negative output terminal; the second time difference amplifier configured to include a second positive input terminal, a second negative input terminal, a second positive output terminal, and a second negative output terminal, and receive an output signal from the first time difference amplifier; a first wiring configured to connect the first positive output terminal and the second positive input terminal; a second wiring configured to connect the first negative output terminal and the second negative input terminal; a third wiring configured to connect the first positive output terminal and the second negative input terminal; a fourth wiring configured to connect the first negative output terminal and the second positive input terminal; a selection circuit configured to include a first selection element and a second selection element, the first selection element connecting one of the first wiring and the fourth wiring to the second positive input terminal, and the second selection element connecting one of the second wiring and the third wiring to the second negative input terminal; and a control circuit configured to control the selection circuit to connect the first time difference amplifier and the second time difference amplifier by the first wiring and the second wiring, or by the third wiring and the fourth wiring.

An embodiment will be now described below with reference to the accompanying drawings. In the following description, the same reference numerals denote the same parts throughout the drawings.

[1] Outline

According to the embodiment of the present invention, when cascading time difference amplifiers in order to obtain a high amplification factor, the time difference offset of an output is reduced by selecting either a series connection (non-twist connection) or twist connection between the time difference amplifiers.

Note that the series connection (non-twist connection) means a case in which the positive output terminal of a time difference amplifier at a preceding stage and the positive input terminal of a time difference amplifier at a succeeding stage are connected to each other, and the negative output terminal of the time difference amplifier at the preceding stage and the negative input terminal of the time difference amplifier at the succeeding stage are connected to each other. The twist connection means a case in which the positive output terminal of a time difference amplifier at a preceding stage and the negative input terminal of a time difference amplifier at a succeeding stage are connected to each other, and the negative output terminal of the time difference amplifier at the preceding stage and the positive input terminal of the time difference amplifier at the succeeding stage are connected to each other.

[2] Arrangement of Time Difference Amplifier Circuit

A time difference amplifier circuit according to the embodiment of the present invention will be explained with reference to FIG. 1. The time difference amplifier circuit according to the embodiment is usable in general integrated circuits such as a general-purpose microcomputer and communication integrated circuit.

As shown in FIG. 1, a time difference amplifier circuit 100 includes cascaded time difference amplifiers TDA1, TDA2, and TDA3, selection circuits 10a and 10b, a control circuit 50, and a storage unit 60.

The time difference amplifiers TDA1, TDA2, and TDA3 are cascaded. More specifically, an output signal from the time difference amplifier TDA1 at the first stage is input to the time difference amplifier TDA2 at the next stage, and an output signal from the time difference amplifier TDA2 is input to the time difference amplifier TDA3 at the final stage. Each of the time difference amplifiers TDA1, TDA2, and TDA3 amplifies the rising edge time difference between two input signals, and outputs the amplified rising edge time difference as the rising edge time difference between two output signals.

The time difference amplifier TDA1 amplifies the rising edge time difference between input signals in1 and in2 respectively input to a positive input terminal 1a and negative input terminal 1b, and outputs the amplified signals from a positive output terminal 1c and negative output terminal 1d, respectively. The time difference amplifier TDA2 amplifies the rising edge time difference between input signals respectively input to a positive input terminal 2a and negative input terminal 2b, and outputs the amplified signals from a positive output terminal 2c and negative output terminal 2d, respectively. The time difference amplifier TDA3 amplifies the rising edge time difference between input signals respectively input to a positive input terminal 3a and negative input terminal 3b, and outputs output signals out1 and out2 from a positive output terminal 3c and negative output terminal 3d, respectively.

The time difference amplifiers TDA1 and TDA2 are connected using wirings I1, I2, I3, and I4. The wiring I1 connects the positive output terminal 1c of the time difference amplifier TDA1 and the positive input terminal 2a of the time difference amplifier TDA2. The wiring I2 connects the negative output terminal 1d of the time difference amplifier TDA1 and the negative input terminal 2b of the time difference amplifier TDA2. The wiring I3 connects the positive output terminal 1c of the time difference amplifier TDA1 and the negative input terminal 2b of the time difference amplifier TDA2. The wiring I4 connects the negative output terminal 1d of the time difference amplifier TDA1 and the positive input terminal 2a of the time difference amplifier TDA2.

Similarly, the time difference amplifiers TDA2 and TDA3 are connected using wirings I5, I6, I7, and I8. The wiring I5 connects the positive output terminal 2c of the time difference amplifier TDA2 and the positive input terminal 3a of the time difference amplifier TDA3. The wiring I6 connects the negative output terminal 2d of the time difference amplifier TDA2 and the negative input terminal 3b of the time difference amplifier TDA3. The wiring I7 connects the positive output terminal 2c of the time difference amplifier TDA2 and the negative input terminal 3b of the time difference amplifier TDA3. The wiring I8 connects the negative output terminal 2d of the time difference amplifier TDA2 and the positive input terminal 3a of the time difference amplifier TDA3.

The selection circuits 10a and 10b are interposed between the time difference amplifiers TDA1 and TDA2 and between the time difference amplifiers TDA2 and TDA3, respectively. The selection circuit 10a includes selection elements S1 and S2. The selection element S1 of the selection circuit 10a connects either the wiring I1 or I4 to the positive input terminal 2a of the time difference amplifier TDA2. The selection element S2 of the selection circuit 10a connects either the wiring I2 or I3 to the negative input terminal 2b of the time difference amplifier TDA2. Also, the selection circuit 10b includes selection elements S1 and S2. The selection element S1 of the selection circuit 10b connects either the wiring I5 or I8 to the positive input terminal 3a of the time difference amplifier TDA3. The selection element S2 of the selection circuit 10b connects either the wiring I6 or I7 to the negative input terminal 3b of the time difference amplifier TDA3.

The control circuit 50 controls switching of the selection elements S1 and S2 in the selection circuits 10a and 10b. More specifically, when series-connecting the time difference amplifiers TDA1 and TDA2, the control circuit 50 connects the terminals 1c and 2a by the selection element S1 using the wiring I1, and connects the terminals 1d and 2b by the selection element S2 using the wiring I2. When twist-connecting the time difference amplifiers TDA1 and TDA2, the control circuit 50 connects the terminals 1d and 2a by the selection element S1 using the wiring I4, and connects the terminals 1c and 2b by the selection element S2 using the wiring I3. Similarly, the control circuit 50 uses the selection circuit 10b to select either the series connection (connection using the wirings I5 and I6) or the twist connection (connection using the wirings I7 and I8) between the time difference amplifiers TDA2 and TDA3.

The storage unit 60 stores information about the test results of time difference offsets in the time difference amplifiers TDA1, TDA2, and TDA3 at the respective stages. Based on this information, the storage unit 60 determines which of the series connection and twist connection is selected as a connection between respective stages, so as to minimize the total time difference offset of the overall time difference amplifier circuit 100. The storage unit 60 supplies a signal corresponding to the determination result to the control circuit 50.

Note that the time difference amplifier circuit 100 according to the embodiment is not limited to the above-described arrangement, and can be variously changed as follows. As the wiring arrangement between time difference amplifiers in the following modification, the wiring arrangement between the time difference amplifiers TDA1 and TDA2 in FIG. 1 will be exemplified. In this case, a wiring arrangement at a portion where the selection circuit is arranged can take the twist connection and series connection using the four wirings I1, I2, I3, and I4. A wiring arrangement at a portion where no selection circuit is arranged can take only the series connection using the two wirings I1 and I2.

(1) The number of cascaded time difference amplifiers TDA1, TDA2, and TDA3 is not limited to three, and may be two, or four or more.

(2) In the example of FIG. 1, the selection circuits 10a and 10b are interposed between the time difference amplifiers TDA1 and TDA2 and between the time difference amplifiers TDA2 and TDA3, respectively. That is, when time difference amplifiers are arranged at n stages, the number of selection circuits is n−1, and the number of selection circuits:the number of intervals between time difference amplifiers=1:1. However, the embodiment is not limited to the arrangement in which selection circuits are interposed between all cascaded time difference amplifiers, respectively.

For example, the arrangement may be changed to omit the selection circuit 10a in FIG. 1 and use one selection circuit 10b for the two time difference amplifiers TDA1 and TDA2. That is, the relationship is changed to the number of selection circuits:the number of intervals between time difference amplifiers=1:2. Selection circuits may be alternately interposed between time difference amplifiers. However, it is unnecessary to always alternately interpose selection circuits between time difference amplifiers.

The number of selection circuits:the number of intervals between time difference amplifiers may be 1:3 or more. In this case, selection circuits may be interposed between time difference amplifiers regularly or irregularly. In the latter case, a larger number of selection circuits may be interposed between time difference amplifiers close to the final stage, compared to selection circuits between time difference amplifiers close to the first stage. This is because adjustment for minimizing the time difference offset of the overall time difference amplifier circuit becomes easy.

Also, one selection circuit may be arranged for all cascaded time difference amplifiers. In this case, one selection circuit may be interposed between a time difference amplifier at the final stage and one at a stage immediately preceding the final stage, or arranged on the output side of a time difference amplifier at the final stage.

In FIG. 1, the selection circuits 10a and 10b are interposed between the time difference amplifiers TDA1 and TDA2 and between the time difference amplifiers TDA2 and TDA3, respectively. However, selection circuits are not limited to the physical arrangement between time difference amplifiers. For example, selection circuits can be physically arranged near the control circuit 50 by laying out wirings from between time difference amplifiers. In this case, one selection circuit can be shared and used between a plurality of cascaded time difference amplifiers.

(3) Determination of connections between the time difference amplifiers TDA1, TDA2, and TDA3 at the respective stages is not limited to determination by the storage unit 60. For example, it is also possible to make a determination by an external circuit outside the time difference amplifier circuit 100, and store the result in the storage unit 60 or control circuit 50. Alternatively, the control circuit 50 may make this determination. Further, the storage unit 60 may not be arranged in the time difference amplifier circuit 100.

[3] Selection Circuit

The selection circuit according to the embodiment of the present invention will be explained with reference to FIGS. 2 and 3. Note that the selection circuit according to the embodiment is not limited to the arrangements in FIGS. 2 and 3, and can be variously changed.

As shown in FIG. 2, each of the selection circuits 10a and 10b may include, e.g., two selectors 11 and 12.

As shown in FIG. 3, the selector 11 includes NAND gates 13 and 14, and inverters 15 and 16. The selector 11 is controlled in accordance with a signal SEL supplied from the control circuit 50 in FIG. 1.

One input terminal of the NAND gate 13 is connected to the positive output terminal 1c at the preceding stage via the wiring I1. The other input terminal of the NAND gate 13 receives the signal SEL supplied from the control circuit 50 in FIG. 1.

One input terminal of the NAND gate 14 is connected to the negative output terminal 1d at the preceding stage via the wiring I4. The other input terminal of the NAND gate 14 receives the signal SEL supplied from the control circuit 50 in FIG. 1 via the inverter 15.

The output terminals of the NAND gates 13 and 14 are connected to the input terminal of the inverter 16. The output terminal of the inverter 16 is connected to the positive input terminal 2a at the next stage.

[4] Time Difference Amplifier

The circuit arrangement of the time difference amplifier according to the embodiment of the present invention will be described with reference to FIGS. 4 and 5.

The time difference amplifier TDA takes a circuit arrangement (open loop TDA) using the metastability of a NAND SR latch, or a circuit arrangement (closed loop TDA) in which variable delay cells are cross-coupled. The former open loop TDA can be formed from only standard logic elements, and can advantageously be designed with a small area. The latter closed loop TDA is advantageously robust to PVT (Process Voltage Temperature) variations to use feedback control. The embodiment will exemplify the open loop TDA as the time difference amplifier TDA, but can also employ the closed loop TDA.

As shown in FIG. 4, the time difference amplifier TDA includes delay circuits 21 and 22 which generate a delay time $T_{off}$, NAND SR latch circuits 23 and 24, XOR gates 25 and 26, and capacitors 27, 28, 29, and 30.

The NAND SR latch circuit 23 is formed by cyclically connecting NAND gates 31 and 32. One input of the NAND gate 31 serves as a set input S, and one input of the NAND gate 32 serves as a reset input R. The set input S is connected to the output of the delay circuit 21, and the reset input R is connected to the input in2 of the time difference amplifier TDA.

The NAND SR latch circuit 24 is formed by cyclically connecting NAND gates 33 and 34. One input of the NAND gate 33 serves as a reset input R, and one input of the NAND gate 34 serves as a set input S. The set input S is connected to the output of the delay circuit 22, and the reset input R is connected to the input in1 of the time difference amplifier TDA.

The XOR gate 25 compares an output signal from the NAND gate 31 and an output signal from the NAND gate 32, and outputs a signal out2. The XOR gate 26 compares an output signal from the NAND gate 33 and an output signal from the NAND gate 34, and outputs a signal out1.

The capacitor 27 has one terminal grounded, and the other terminal connected to one input of the XOR gate 25. The capacitor 28 has one terminal grounded, and the other terminal connected to the other input of the XOR gate 25. The capacitor 29 has one terminal grounded, and the other terminal connected to one input of the XOR gate 26. The capacitor 30 has one terminal grounded, and the other terminal connected to the other input of the XOR gate 26.

The time difference amplifier TDA having this circuit arrangement utilizes the following characteristic. When the rising edge times of the input signals in1 and in2 are almost equal, outputs from the NAND SR latch circuits 23 and 24 become metastable, and the recovery time from this state is proportional to the rising edge time difference between the input signals.

Note that the time difference amplifier TDA according to the embodiment is not limited to the arrangement in FIG. 4, and can be changed to, e.g., the arrangement in FIG. 5.

In the time difference amplifier TDA of FIG. 5, the delay times $T_{off}$ of the delay circuits 21 and 22 on the input side are implemented by an inverter chain. More specifically, the delay circuit 21 is formed from two chain-connected inverters 35 and 36. The delay circuit 22 is formed from two chain-connected inverters 37 and 38.

In the time difference amplifier TDA of FIG. 5, the XOR gates 25 and 26 on the output side are configured to prevent outputs from becoming unstable when the NAND SR latch circuits 23 and 24 become metastable. More specifically, the XOR gate 25 includes inverters 39 and 40 and an OR gate 43. The XOR gate 26 includes inverters 41 and 42 and an OR gate 44.

In the time difference amplifier TDA of FIG. 5, the inverter chain of each of the delay circuits 21 and 22 is formed from two inverters. However, the number of inverters is not limited to this, and may be three or more. As the number of inverters becomes larger, the delay time $T_{off}$ becomes longer.

In the time difference amplifier TDA of FIG. 4, the delay circuits 21 and 22 can be changed to those in FIG. 5, or the XOR gates 25 and 26 can be changed to those in FIG. 5.

[5] Effects

The effects of the cascaded time difference amplifier circuit in the embodiment will be explained with reference to FIGS. 6, 7A, 7B, 8, 9A, 9B, 10, 11, 12A, and 12B.

In the cascaded time difference amplifier circuit 100 of the embodiment, the selection circuit can switch the wiring arrangement between the time difference amplifiers TDA to the series connection or twist connection.

In the embodiment, the characteristic (sign of the time difference offset) in the time difference amplifier TDA at each stage is tested. Based on the test results, wiring between the time difference amplifiers TDA is reconfigured to the series connection or twist connection to minimize the total time difference offset (see FIG. 6). To shorten the test time, characteristic tests at respective stages may be parallelly processed.

Figures 7A, 7B:
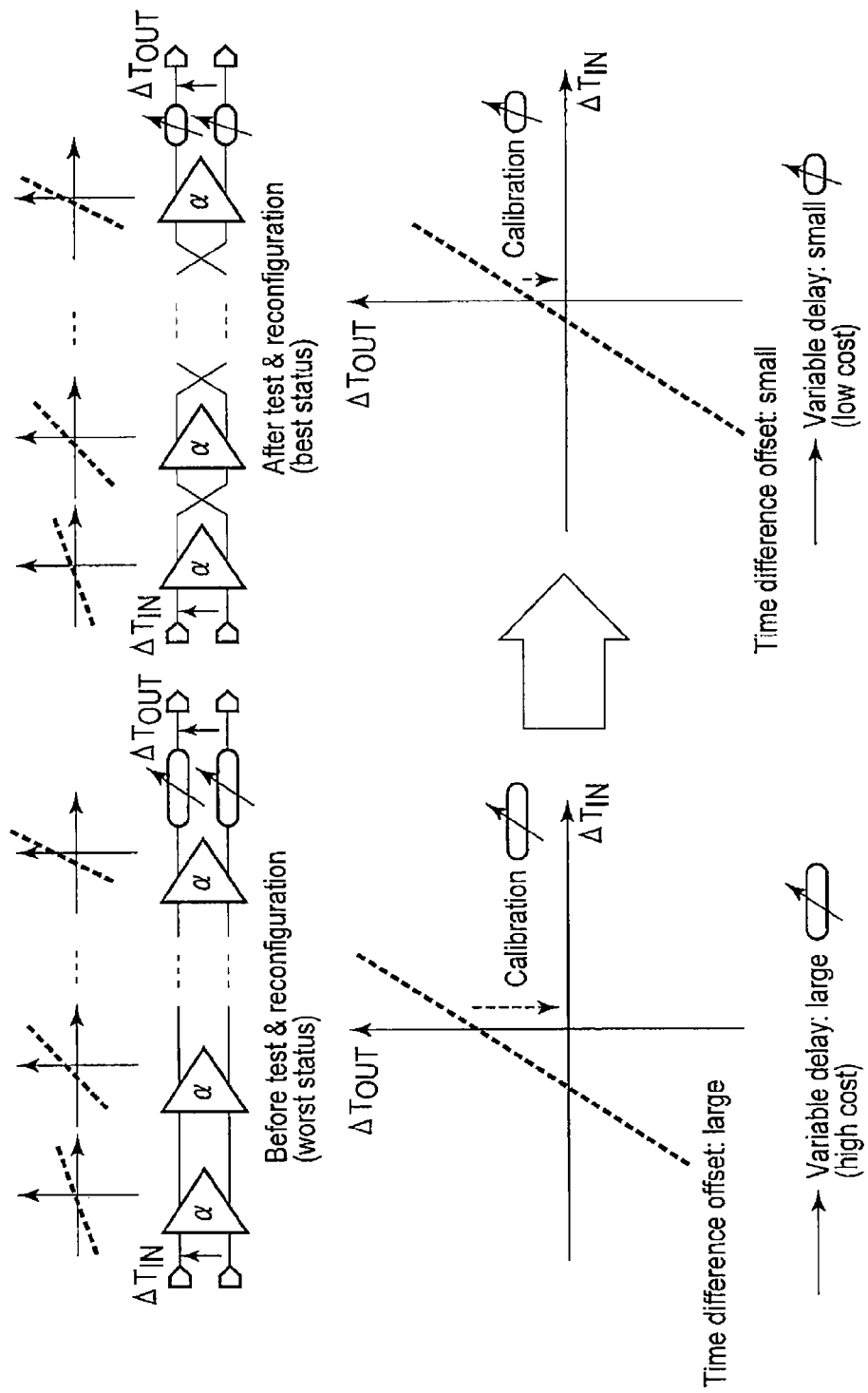
FIGS. 7A and 7B are views showing a time difference offset reduction effect in the time difference amplifier circuit according to the present invention.

In a conventional cascaded time difference amplifier circuit, as shown in FIG. 7A, the wiring is not configured by the twist connection, unlike the embodiment. Hence, the time difference offset is large, the variable delay for compensating it is large, and the cost is high. To the contrary, in the cascaded time difference amplifier circuit 100 of the embodiment, the characteristic test and wiring reconfiguration are performed as shown in FIG. 7B. This can reduce the time difference offset, variable delay, and cost. The reduction of the time difference offset in the embodiment will be described in detail below.

Figure 8:
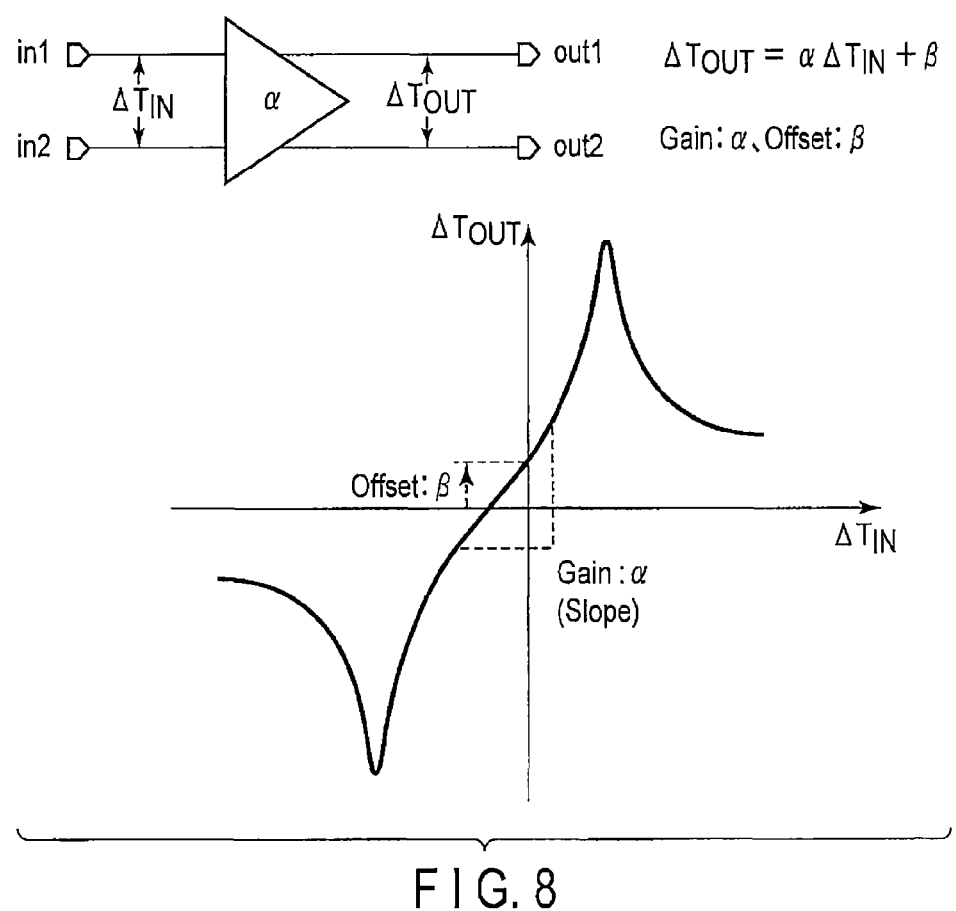
FIG. 8 is a view showing a model of the gain and time difference offset of the time difference amplifier circuit.

As shown in FIG. 8, the characteristic of the time difference amplifier TDA is modeled. Letting α be the gain of the time difference amplifier TDA and β be the offset (β>0), the rising edge time difference $\Delta T_{IN}$ between the input signals in1 and in2 and the rising edge time difference $\Delta T_{OUT}$ between the output signals out1 and out2 have the following relationship:

$$\Delta T_{OUT} = \alpha \Delta T_{IN} + \beta \quad (1)$$

Figure 9A:
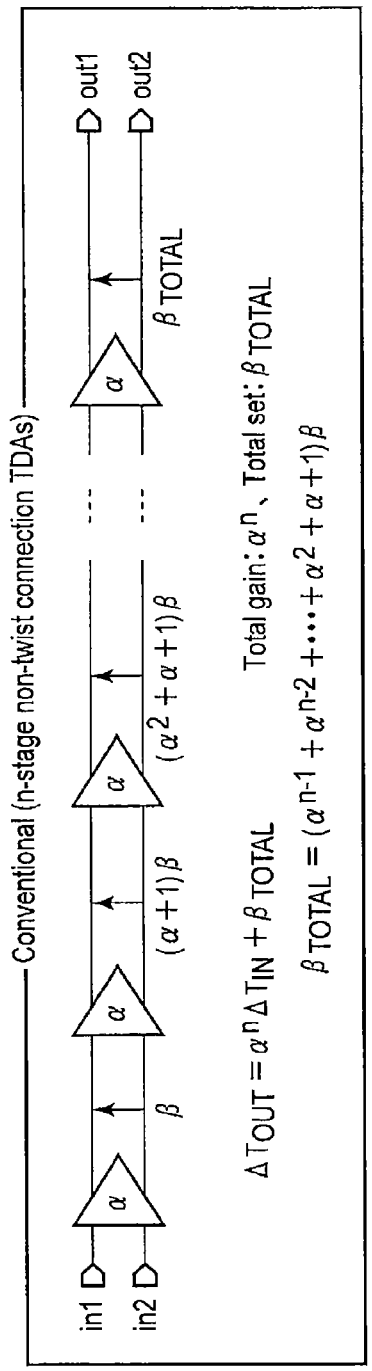
FIGS. 9A and 9B are views showing the total time difference offset in a conventional time difference amplifier circuit and the time difference amplifier circuit according to the present invention.
Figure 9B:
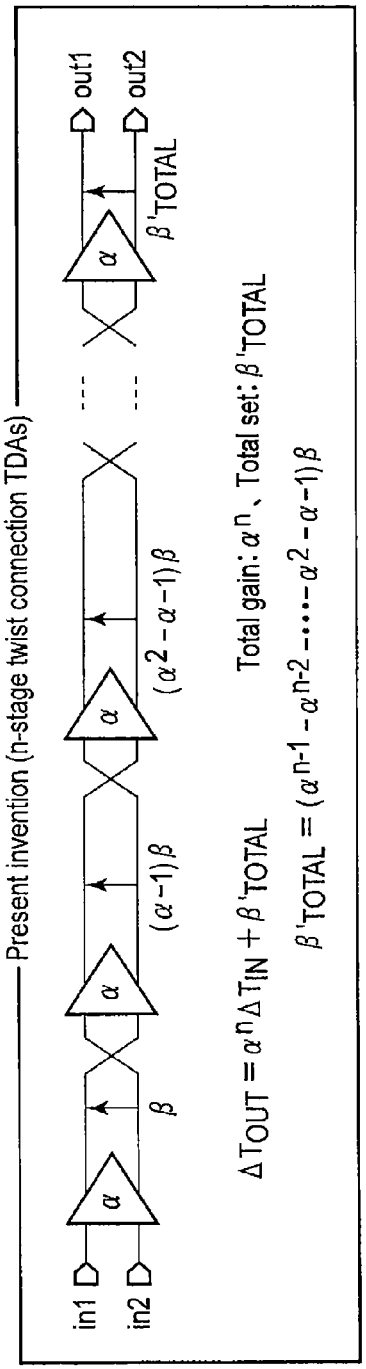

The time difference offsets of the cascaded time difference amplifiers TDA can be mathematically expressed as shown in FIGS. 9A and 9B.

As shown in FIG. 9A, the total time difference offset $\beta_{TOTAL}$ of conventional n-stage non-twist connection time difference amplifiers is given by $$\beta_{TOTAL} = (\alpha^{n-1} + \alpha^{n-2} + \ldots + \alpha^2 + \alpha + 1)\beta \quad (2)$$

As is apparent from equation (2), the conventional offset $\beta_{TOTAL}$ increases as the number of stages of time difference amplifiers increases.

In contrast, as shown in FIG. 9B, the total time difference offset $\beta'_{TOTAL}$ of the n-stage twist connection time difference amplifier circuit 100 according to the embodiment is given by $$\beta'_{TOTAL} = (\alpha^{n-1} - \alpha^{n-2} - \ldots - \alpha^2 - \alpha - 1)\beta \quad (3)$$

As is apparent from equation (3), the embodiment can greatly reduce the time difference offset even if the number of stages of time difference amplifiers TDA increases.

More specifically, as shown in FIG. 10, the twist connection time difference amplifier circuit 100 in the embodiment can reduce the total time difference offset as the number of stages of time difference amplifiers TDA increases, compared to the conventional non-twist connection time difference amplifier circuit. As is apparent from FIG. 11, the rate of decrease of the total time difference offset in the embodiment rises at all gains of 2 to 4 per stage as the number of stages of time difference amplifiers TDA increases.

Figures 12A, 12B:
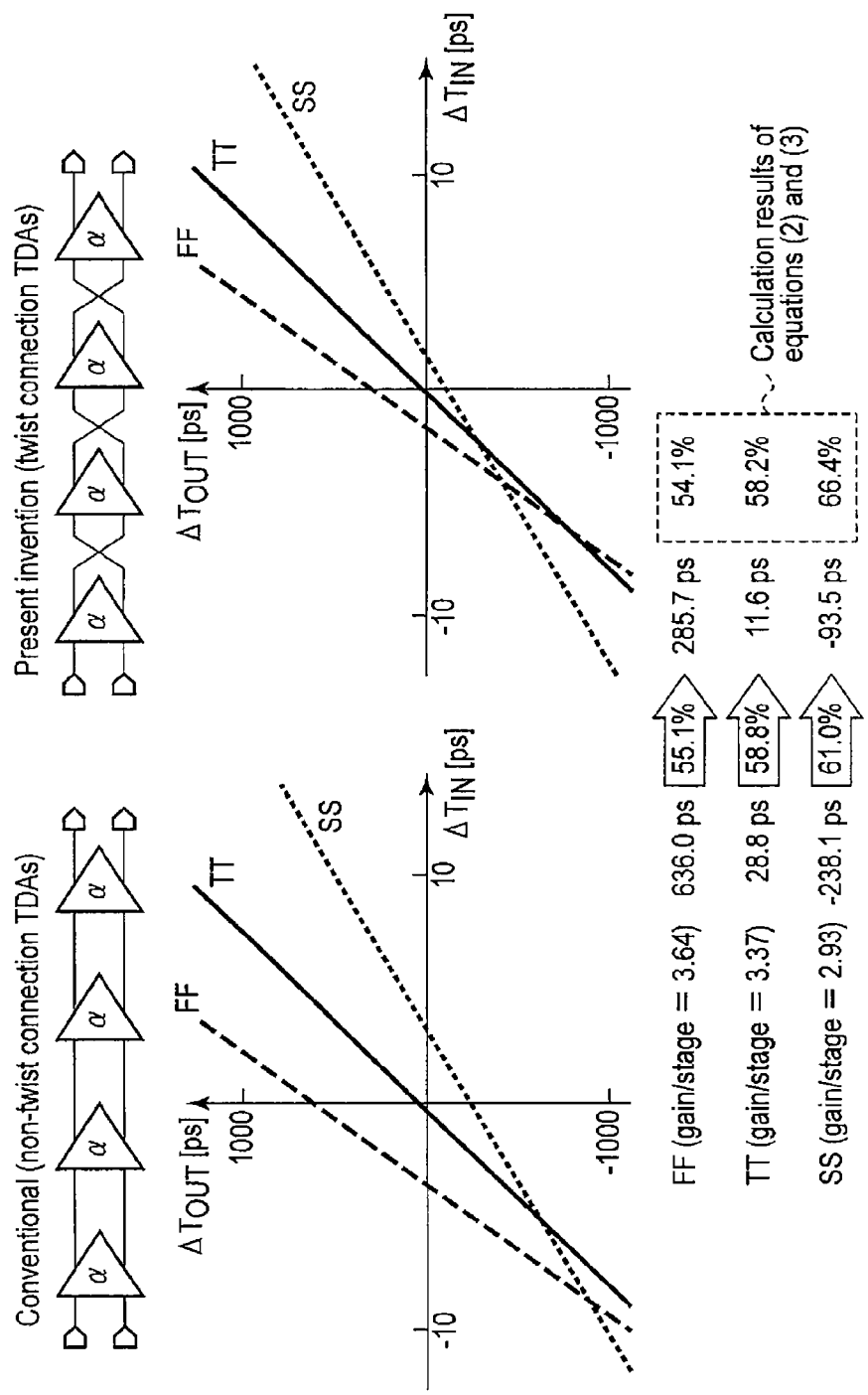
FIGS. 12A and 12B are views showing the simulation result of the time difference offset for each process condition in the conventional time difference amplifier circuit and the time difference amplifier circuit according to the present invention.

FIGS. 12A and 12B show the simulation results of three types of total time difference offsets in a conventional four-stage connection time difference amplifier circuit and a four-stage connection time difference amplifier circuit according to the present invention. The three types are FF (gain/stage=3.64), TT (gain/stage=3.37), and SS (gain/stage=2.93).

A comparison between the conventional total time difference offset and the total time difference offset of the embodiment reveals that the total time difference offset can be greatly reduced from 636.0 ps to 285.7 ps (reduction of 55.1%) for the FF type, from 28.8 ps to 11.6 ps (reduction of 58.8%) for the TT type, and from −238.1 ps to −93.5 ps (reduction of 61.0%) for the SS type. The calculation results of equations (2) and (3) are 54.1% for the FF type, 58.2% for the TT type, and 66.4% for the SS type. These results are almost equal to the simulation results.

As described above, in the embodiment, when mounting the cascaded time difference amplifier circuit 100 on an integrated circuit or the like, the time difference offset of the time difference amplifier TDA at each stage is tested. Based on the test results, the wiring is reconfigured to the twist connection to minimize the total time difference offset of the cascaded time difference amplifier circuit 100. This arrangement can minimize the output time offset.

When the trend of generation of the time difference offset is known in advance (for example, the trend of manufacturing variations is known and can be predicted from the arrangement of building components), the wiring is configured to the twist connection before the test. This can minimize the time difference offset.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A time difference amplifier circuit in which a plurality of time difference amplifiers are cascaded, each of the plurality of time difference amplifiers amplifying a rising edge time difference between two input signals and outputting the amplified rising edge time difference as a rising edge time difference between two output signals, and each of the plurality of time difference amplifiers including a first time difference amplifier and a second time difference amplifier, comprising:

the first time difference amplifier configured to include a first positive input terminal, a first negative input terminal, a first positive output terminal, and a first negative output terminal;

the second time difference amplifier configured to include a second positive input terminal, a second negative input terminal, a second positive output terminal, and a second negative output terminal, and receive an output signal from the first time difference amplifier;

a first wiring configured to connect the first positive output terminal and the second positive input terminal;

a second wiring configured to connect the first negative output terminal and the second negative input terminal;

a third wiring configured to connect the first positive output terminal and the second negative input terminal;

a fourth wiring configured to connect the first negative output terminal and the second positive input terminal;

a selection circuit configured to include a first selection element and a second selection element, the first selection element connecting one of the first wiring and the fourth wiring to the second positive input terminal, and the second selection element connecting one of the second wiring and the third wiring to the second negative input terminal;

a control circuit configured to control the selection circuit to connect the first time difference amplifier and the second time difference amplifier by the first wiring and the second wiring, or by the third wiring and the fourth wiring so as to reduce a total time difference offset of the plurality of time difference amplifiers based on test results of characteristics of time difference offsets of the plurality of time difference amplifiers, and a storage circuit configured to store information about the test results of the characteristics of the time difference offsets of the plurality of time difference amplifiers, and supply a signal based on the information to the control circuit.

2. The circuit according to claim 1, wherein each of the first selection element and the second selection element is formed from a selector.

3. The circuit according to claim 1, further comprising a plurality of selection circuits configured to include the selection circuit, the plurality of selection circuits being interposed between the plurality of time difference amplifiers, respectively.

4. The circuit according to claim 1, further comprising a plurality of selection circuits configured to include the selection circuit,
wherein a first arrangement in which a selection circuit among the plurality of selection circuits is arranged, and a second arrangement in which a selection circuit among the plurality of selection circuits is not arranged exist between the plurality of time difference amplifiers.

5. The circuit according to claim 4, wherein the first arrangement and the second arrangement alternately exist between the plurality of time difference amplifiers.

* * * * *